(12) United States Patent
Konishi et al.

(10) Patent No.: US 8,514,147 B2
(45) Date of Patent: Aug. 20, 2013

(54) EBG STRUCTURE, ANTENNA DEVICE, RFID TAG, NOISE FILTER, NOISE ABSORPTIVE SHEET AND WIRING BOARD WITH NOISE ABSORPTION FUNCTION

(75) Inventors: Takayoshi Konishi, Sendai (JP); Koichi Kondo, Sendai (JP); Satoshi Arai, Sendai (JP); Shigeyoshi Yoshida, Sendai (JP)

(73) Assignee: NEC Tokin Corporation, Sendai-Shi, Miyagi (JP)

( * ) Notice: Subject to any disclaimer, the term of this patent is extended or adjusted under 35 U.S.C. 154(b) by 343 days.

(21) Appl. No.: 12/516,130

(22) PCT Filed: Nov. 22, 2007

(86) PCT No.: PCT/JP2007/001287
§ 371 (c)(1),
(2), (4) Date: May 22, 2009

(87) PCT Pub. No.: WO2008/062562
PCT Pub. Date: May 29, 2008

(65) Prior Publication Data
US 2010/0053013 A1  Mar. 4, 2010

(30) Foreign Application Priority Data

Nov. 22, 2006  (JP) .................................. 2006-316210

(51) Int. Cl.
*H01Q 15/02* (2006.01)
(52) U.S. Cl.
USPC .................................... 343/909; 343/700 MS
(58) Field of Classification Search
USPC .......................................... 343/700 MS, 909
See application file for complete search history.

(56) References Cited

U.S. PATENT DOCUMENTS

| 6,483,480 B1 | 11/2002 | Sievenpiper et al. |
| 6,512,494 B1 | 1/2003 | Diaz et al. |
| 6,538,621 B1 | 3/2003 | Sievenpiper et al. |
| 6,552,696 B1 | 4/2003 | Sievenpiper et al. |
| 6,670,932 B1 | 12/2003 | Diaz et al. |

(Continued)

FOREIGN PATENT DOCUMENTS

| JP | 11-330770 A | 11/1999 |
| JP | 2002-204123 A | 7/2002 |

(Continued)

OTHER PUBLICATIONS

Bell, J.M., "Ultra-wideband and low-profile hybrid EBG/ferrite ground plane for airborne foliage penetrating radar," Antennas and Propagation Society International Symposium, 2006, pp. 369-372.
Zhao Xiaoying, "Study on 2-D Gyrotropic EBG by FEM," IEEE International Symposium on Microwave, Antenna, Propagation and EMC Technologies for Wireless Communication, 2005, pp. 827-830, vol. 1.
Kern, D.J., "Metaferrites: using electromagnetic bandgap structures to synthesize metamaterial ferrites," IEEE Transactions on Antennas and Propagation, Apr. 2005, pp. 1382-1389, vol. 53, No. 4.
Kern, J.D., "The Synthesis of metamaterial ferrites for RF applications using electromagnetic bandgap structures," Antennas and Propagation Society International Symposium, 2003, IEEE, pp. 497-500, vol. 1.

(Continued)

*Primary Examiner* — Dieu H Duong
(74) *Attorney, Agent, or Firm* — Holtz Holtz Goodman & Chick PC

(57) ABSTRACT

An EBG (Electromagnetic Bandgap) structure includes a magnetic material portion at least in part. It is preferable to arrange the magnetic material portion close to or, if possible, in contact with a conductor forming the EBG structure, for example, at least a portion of a ground conductor, a conductor producing a capacitance, and/or a conductor producing an inductance, such as a via. Examples of the magnetic material portion include a ferrite plating film, a composite magnetic material layer including magnetic powder and resin binder, and the like.

10 Claims, 9 Drawing Sheets

(56) References Cited

U.S. PATENT DOCUMENTS

| | | |
|---|---|---|
| 6,972,727 B1 | 12/2005 | West et al. |
| 7,411,565 B2 * | 8/2008 | McKinzie et al. ............ 343/909 |
| 2003/0052834 A1 | 3/2003 | Sievenpiper et al. |
| 2003/0122729 A1 | 7/2003 | Diaz et al. |
| 2004/0087135 A1 | 5/2004 | Canaperi et al. |
| 2004/0157085 A1 * | 8/2004 | Kondo et al. ................. 428/692 |
| 2005/0029632 A1 * | 2/2005 | McKinzie et al. ............ 257/665 |
| 2005/0146402 A1 | 7/2005 | Sarabandi et al. |
| 2005/0186778 A1 | 8/2005 | Canaperi et al. |
| 2006/0044209 A1 | 3/2006 | Reynet et al. |
| 2006/0050010 A1 | 3/2006 | Choi et al. |
| 2006/0054710 A1 * | 3/2006 | Forster et al. ................. 235/492 |
| 2006/0152430 A1 | 7/2006 | Seddon et al. |

FOREIGN PATENT DOCUMENTS

| | | |
|---|---|---|
| JP | 2003-529259 A | 9/2003 |
| JP | 2004-146800 A | 5/2004 |
| JP | 2004-535722 A | 11/2004 |
| JP | 2005-538629 A | 12/2005 |
| JP | 2006-245984 A | 9/2006 |
| WO | WO 2004/034504 A1 | 4/2004 |
| WO | WO 2005/024999 A1 | 3/2005 |
| WO | WO 2005/076408 A1 | 8/2005 |

OTHER PUBLICATIONS

Tsuyoshi Nomura, "Electromagnetic Simulator using Topology Optimization Method—Design of Electromagnetic Band-gap Material Structure," Technical Report of IEICE, Jun. 2005, pp. 21-25.

International Search Report dated Dec. 6, 2007 issued in counterpart International Application Serial No. PCT/JP2007/001287.

Japanese Office Action for application No. 2008-545315 mailed Nov. 22, 2012 (including an English translation).

Park, Jongbae et al., "Double-Stacked EBG Structure for Wideband Suppression of Simultaneous Switching Noise in LTCC-Based SiP Applications," IEEE Microwave and Wireless Components Letters, Sep. 2006, pp. 481-483, vol. 16, Issue 9.

Kim, Dowon and Kim, Moonil, "An Investigation of Electromagnetic Bandgap Structure as an Efficient Microstrip Antenna," IEICE Technical Report, Oct. 7, 2005, pp. 45-48.

* cited by examiner

EBG STRUCTURE, ANTENNA DEVICE, RFID TAG, NOISE FILTER, NOISE ABSORPTIVE SHEET AND WIRING BOARD WITH NOISE ABSORPTION FUNCTION

This application is a U.S. National Phase Application under 35 USC 371 of International Application PCT/JP2007/001287 filed Nov. 22, 2007.

TECHNICAL FIELD

This invention relates to an EBG (Electromagnetic Bandgap) structure and an antenna device, an RFID (Radio Frequency Identification) tag, a noise filter, a noise absorption sheet, and a wiring board with a noise absorption function, each of which uses an EBG structure.

BACKGROUND ART

In recent years, an EBG structure has attracted attention as a device or a material. The EBG structure is a structure in which unit structures, which can be expressed by a certain equivalent circuit, are cyclically coupled to each other. The EBG structure has been known to have two main functions.

One of those functions is to provide a high surface impedance in a frequency band including a resonance frequency of an LC parallel resonant circuit that is an equivalent circuit into which the structure is simplified when the structure is viewed in a direction perpendicular to a principal plane of the structure. For example, this mechanism and examples of an EBG structure are disclosed by U.S. Pat. No. 6,538,621 (Patent Document 1).

Another characteristic of the EBG structure is to block transmission of signals or noises in a predetermined frequency band when the structure is viewed in a direction parallel to the principal plane of the EBG structure. In brief, this function utilizes a mechanism in which incoming signals and noises are damped by cyclically arranged unit structures which form an evanescent field with respect to a certain frequency. For example, some proposals with regard to this function are disclosed by United States Patent Publication No. 2006/0050010A1 (Patent Document 2).

Furthermore, there has been proposed a left-handed material that needs no vias and has scalability over restrictions from the via density (see, e.g., Japanese Patent Publication No. 2006-245984 (Patent Document 3)).

DISCLOSURE OF INVENTION

Problem(s) to be Solved by the Invention

If an inductance component or a capacitance component is increased, a region providing a high surface impedance or a signal/noise transmission blocking region can be shifted toward lower frequencies. As can be understood in consideration of the scaling law, the fact that the characteristics can be shifted toward lower frequencies means that the EBG structure can be miniaturized. Therefore, in any assumable use, there is a demand for a larger inductance component or capacitance component.

An increase of an inductance component or a capacitance component in an EBG structure needs a variety of considerations to a physical structure and a geometric structure. However, when the increase merely relies upon changes of a geometric structure, it is difficult to apply such changes to other structures. Thus, this approach problematically lacks technical versatility.

This invention has been made by searching for technology that contributes to miniaturization of an EBG structure and is highly versatile. It is, therefore, an object of this invention to provide an EBG structure using such technology and applied technology thereof.

Means to Solve the Problem

When a geometric structure is so designed as to shift the characteristics toward lower frequencies, a capacitance component can be increased more readily than an inductance component. Therefore, various ideas have heretofore been proposed to increase a capacitance component.

The inventors of this invention have found that to increase an inductance component to shift the characteristics toward lower frequencies brings supplementary benefits to the characteristics. Additionally, the inventors have found that provision of a magnetic material layer or a magnetic material film on an EBG structure increases an inductance component.

This invention is based upon the above findings. Specifically, an EBG structure includes a magnetic material portion at least in part as a means to solve the aforementioned problems. It is preferable to arrange the magnetic material portion close to or, if possible, in contact with a conductor forming the EBG structure, for example, at least a portion of a ground conductor, a conductor producing a capacitance, and/or a conductor producing an inductance, such as a via. Examples of the magnetic material portion include a ferrite plating film, a composite magnetic material layer including magnetic powder and resin binder, and the like.

Effect(s) of the Invention

Provision of a magnetic material portion on an EBG structure increases an inductance component, thereby contributing to miniaturization of the EBG structure.

Figure 1:
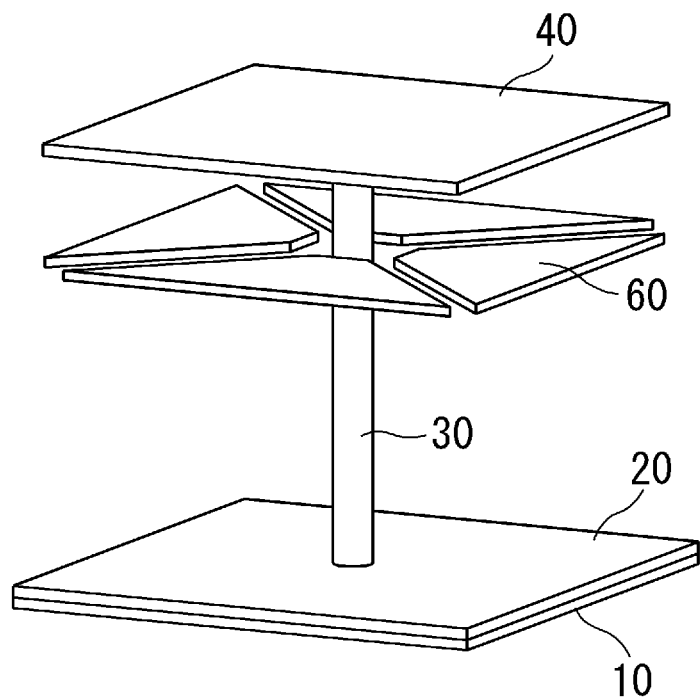
FIG. 1 is a perspective view schematically showing a unit structure of an EBG structure according to a first embodiment of this invention.

DESCRIPTION OF REFERENCE NUMERALS 1, 1', 1" EBG structure
2 Antenna support layer
3 Antenna element
4 IC
5 Shield support layer
6 Shield layer
10 Ground layer
20, 21 Magnetic material layer
30 Via
40 Top layer
50 Dielectric layer
60 Floating capacitor layer

BEST MODE FOR CARRYING OUT THE INVENTION

Miniaturization technology for an EBG structure according to a first embodiment of this invention will be described below with an example of an EBG structure shown in FIGS. 1 to 3.

Figure 2:
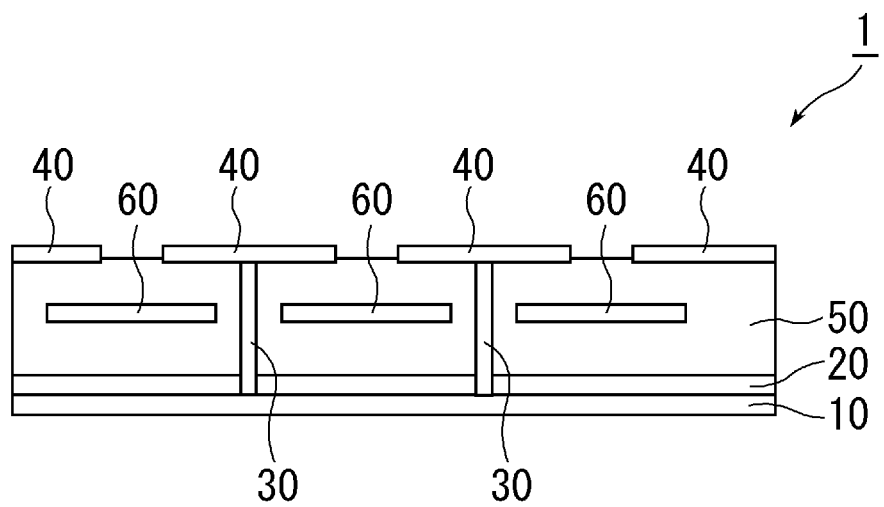
FIG. 2 is a cross-sectional view of the EBG structure according to the first embodiment of this invention.
Figure 3:
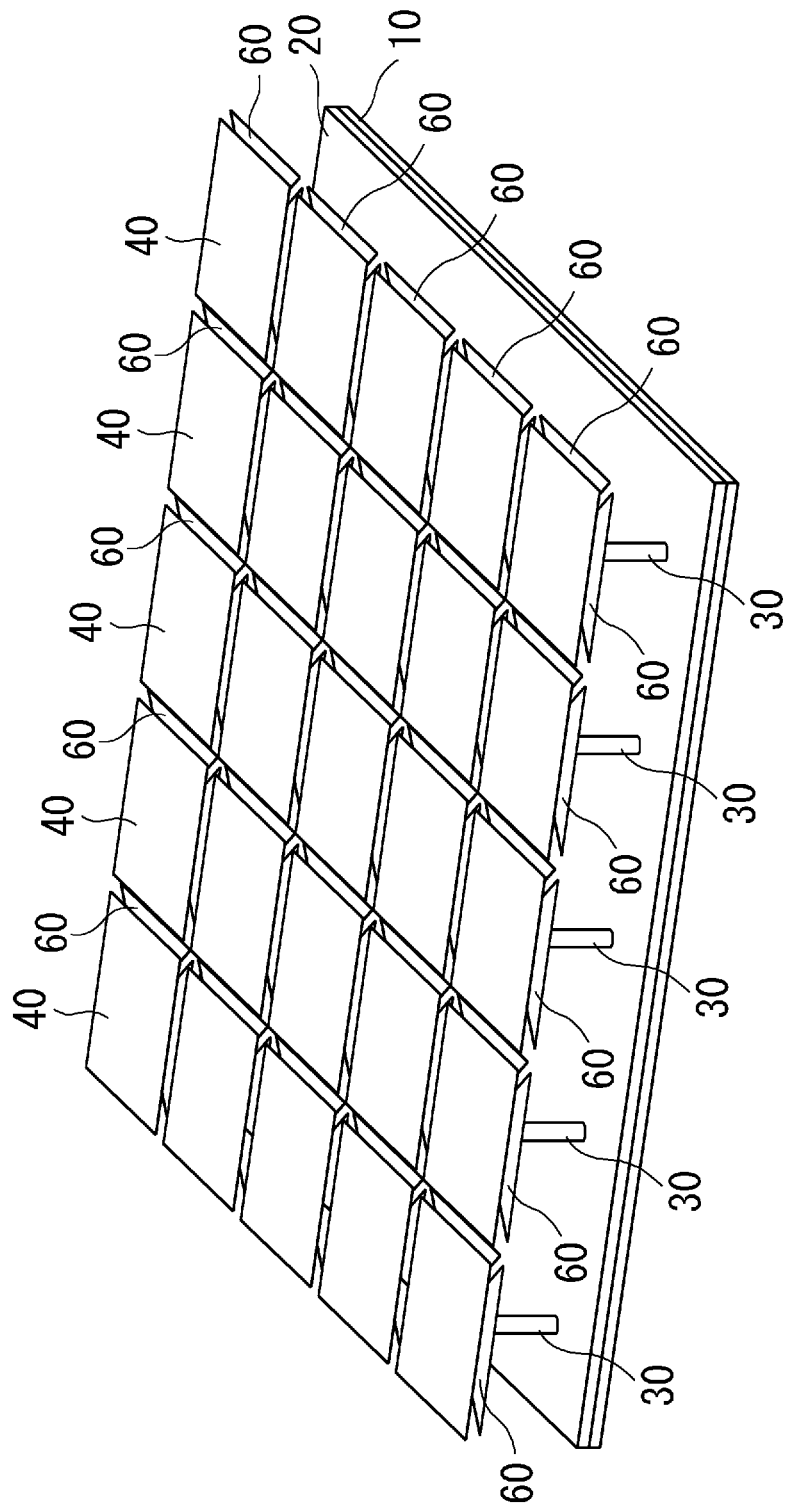
FIG. 3 is a perspective view schematically showing the EBG structure according to the first embodiment of this invention.

As can be seen from FIGS. 1 to 3, an EBG structure 1 of this embodiment is a structure in which a magnetic material layer 20 is provided to a structure in which floating capacitor layers 60 have been added to what is called mushroom-type structures. Specifically, the EBG structure 1 of this embodiment has a ground layer 10 formed of a conductive layer having a solid pattern, a magnetic material layer 20 formed on the ground layer 10, vias 30 extending vertically from the ground layer 10, top layers 40 coupled to the ground layer by the vias 30, a dielectric layer 50 filled between the top layers 40 and the magnetic material layer 20, and floating capacitor layers 60 held in a floating state within the dielectric layer 50 for increasing the capacity. The dielectric layer 50 is omitted from FIGS. 1 and 3 to clarify the relationship between the components.

The magnetic material layer 20 of this embodiment comprises a ferrite plating film formed by a ferrite plating method. As disclosed in Japanese Patent No. 1475891, the ferrite plating method is a method of forming a ferrite film on a surface of a solid by bringing a solution containing at least ferrous ions as metal ions into the surface of the solid, adsorbing $Fe^{2+}$ or $Fe^{2+}$ and other metal hydroxide ions onto the surface of the solid, subsequently oxidizing the adsorbed $Fe^{2+}$ to obtain $Fe^{3+}$, and using $Fe^{3+}$ to cause a ferrite crystallization reaction between $Fe^{3+}$ and the metal hydroxide ions in the solution. A ferrite plating film formed by this method has a structure in which crystal phases are arranged close to each other, so that a small degree of anisotropy dispersion due to exchange coupling can be expected. The ferrite plating film has a natural resonance frequency higher than that of a bulk ferrite by an order of magnitude. (The profile of the real part of the magnetic permeability $\mu'$ extends over a higher frequency) Furthermore, the natural resonance frequency can also be controlled by changing the composition. (Y. Shimada, N. Matsushita, M. Abe, K. Kondo, T. Chiba, and S. Yoshida, J. Magn. Magn. Mater., 278, 256 (2004).)

For fundamental study to examine the effects of bringing a ferrite plating film close to a conductive layer included in an EBG structure, the electromagnetic characteristics of the ferrite film itself were evaluated.

Figure 4:
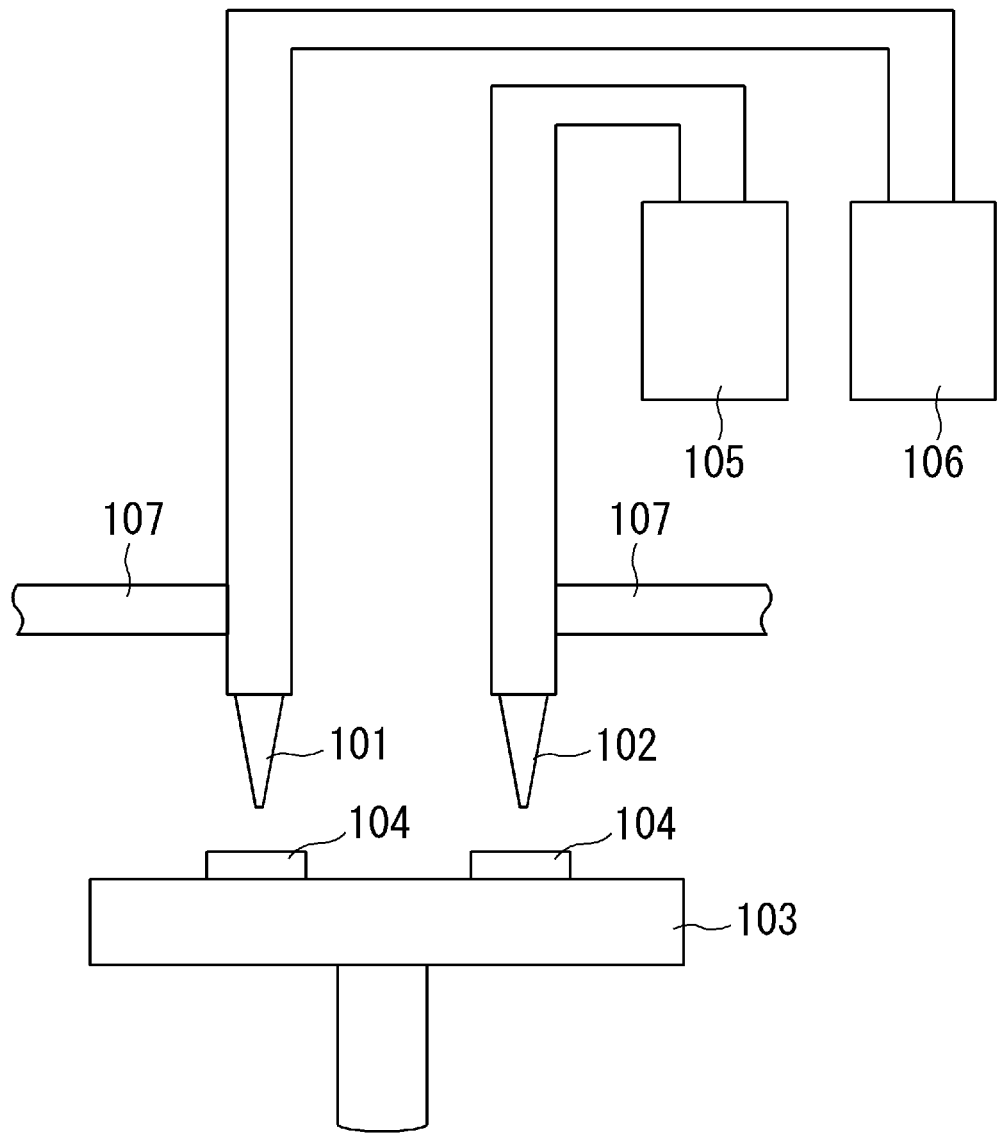
FIG. 4 is a diagram used to explain an apparatus for manufacturing a ferrite plating film.

A ferrite plating film manufacturing apparatus as schematically shown in FIG. 4 was used for deposition of a ferrite plating film. In FIG. 4, substrates (support members) 104 on which a ferrite film is to be formed are placed on a rotatable table 103. Solutions stored in tanks 105 and 106 for storing liquids necessary for plating are supplied to the substrates 104 via nozzles 101 and 102 together with nitrogen gas supplied from gas outlets 107. At that time, for example, the apparatus repeats a step of supplying the solution to the substrate 104 via the nozzle 101 and then removing an excessive solution by centrifugal forces due to the rotation and a step of supplying the solution to the substrate 104 via the nozzle 102 and then removing the solution by centrifugal forces due to the rotation.

A polyimide sheet having a thickness of 25 μm was placed on the rotatable table 103 in the apparatus shown in FIG. 4. While the rotatable table was rotated at 150 rpm, deoxidized ion exchange water was supplied thereon. The atmosphere was heated up to 90° C. Subsequently, an $N_2$ gas was introduced into the interior of the apparatus so as to form a deoxidized atmosphere in the apparatus. $FeCl_2.4H_2O$, $NiCl_26H_2O$, $ZnCl_2$, and $CoCl_26H_2O$ had been dissolved in the deoxidized ion exchange water at molar ratios respectively listed in Table 1 to generate the reaction solutions. An oxidation solution in which $NaNO_2$ and $CH_3COONH_4$ had been dissolved in deoxidized ion exchange water and the aforementioned reaction solutions were supplied from the nozzles 101 and 102 respectively at a flow rate of about 40 ml/min. Each substrate 104 was thus processed, and a black film (ferrite film) was formed thereon. The structure observation using a SEM showed that a structure having uniform film thickness had been formed. The chemical composition of the film was determined by dissolving a film of about a 3-cm square to about a 5-cm square in a hydrochloric acid and using an inductively coupled plasma emission spectrometry method (ICPS). The magnetic permeability of the film was measured with a magnetic permeability meter using a shielded loop coil method. The direct-current resistivity $\rho_v$ (unit: Ωcm) in the in-plane direction of the ferrite film was calculated from the measurement value of the surface resistivity $\rho_s$ (unit: Ω/sq) by the following formula:

$$\rho_v = \rho_s \times t$$

where t (unit: cm) represents a film thickness. For $\rho_s$ of 104 Ω/sq or less, a four-probe method (constant current application, JIS K 7194) was used to measure $\rho_s$. For $\rho_s$ of 104 Ω/sq or more, a double-ring method (constant voltage application and leakage current measurement, JIS K 6911) was used to measure $\rho_s$. The measurement results are also shown in Table 1 below. Although the amount of oxygen in the film depends upon the ferrite composition $M_3O_4$ (M: metal element), oxygen defects or oxygen excesses are permissible.

TABLE 1

| | Composition of reaction solution (mol %) | | | | Composition of film (mol %) | | | |
|---|---|---|---|---|---|---|---|---|
| | Fe | Ni | Zn | Co | Fe | Ni | Zn | Co |
| IM1 | 64.9 | 19.6 | 0.7 | 14.9 | 2.2 | 0.3 | 0.3 | 0.2 |
| IM2 | 64.2 | 20.1 | 0.7 | 14.9 | 2.2 | 0.2 | 0.3 | 0.3 |
| IM3 | 64.7 | 19.7 | 0.7 | 14.9 | 2.1 | 0.2 | 0.4 | 0.3 |
| IM4 | 65.6 | 19.6 | 0.0 | 14.7 | 2.5 | 0.2 | 0.0 | 0.3 |
| IM5 | 64.2 | 20.1 | 0.4 | 15.3 | 2.3 | 0.2 | 0.2 | 0.3 |
| IM6 | 65.2 | 20.5 | 0.7 | 13.6 | 2.2 | 0.2 | 0.3 | 0.3 |
| IM7 | 64.0 | 20.1 | 0.7 | 15.2 | 2.2 | 0.2 | 0.3 | 0.3 |
| IM8 | 63.5 | 18.7 | 0.6 | 17.2 | 2.4 | 0.0 | 0.2 | 0.4 |
| IM9 | 78.0 | 0.0 | 0.0 | 21.2 | 2.6 | 0.0 | 0.0 | 0.4 |
| IM10 | 72.9 | 22.1 | 0.7 | 4.2 | 2.5 | 0.2 | 0.2 | 0.1 |
| IM11 | 69.7 | 10.6 | 0.3 | 19.4 | 2.4 | 0.1 | 0.1 | 0.4 |
| IM12 | 81.9 | 0.0 | 0.0 | 18.1 | 2.7 | 0.0 | 0.0 | 0.3 |
| IM13 | 67.5 | 0.0 | 0.0 | 32.5 | 2.5 | 0.0 | 0.0 | 0.5 |
| IM14 | 59.9 | 25.0 | 0.0 | 15.0 | 2.3 | 0.4 | 0.0 | 0.3 |
| IM15 | 73.2 | 22.3 | 0.8 | 3.7 | 2.6 | 0.1 | 0.2 | 0.1 |
| CM1 | 86.0 | 0.0 | 0.0 | 14.0 | 2.8 | 0.0 | 0.0 | 0.2 |
| CM2 | 75.3 | 23.9 | 0.8 | 0.0 | 2.6 | 0.2 | 0.2 | 0.0 |
| CM3 | 71.1 | 22.5 | 2.3 | 4.1 | 2.2 | 0.2 | 0.5 | 0.1 |

| | Film Thickness t (μm) | ρ (Ωcm) | $\mu'$ at 50 MHz | $\mu'$ at 950 MHz | $\mu''$ at 950 MHz | $\mu''/\mu'$ at 950 MHz | t × $\mu'$ at 950 MHz(μm) | fr(MHz) |
|---|---|---|---|---|---|---|---|---|
| IM1 | 1.2 | 4.E+05 | 7 | 7 | 1.6 | 0.2 | 8 | 3300 |
| IM2 | 1.0 | 3.E+06 | 6 | 6 | 1.5 | 0.3 | 6 | 3300 |
| IM3 | 1.3 | 3.E+06 | 7 | 7 | 3 | 0.4 | 9 | 2000 |
| IM4 | 1.2 | 3.E+04 | 8 | 8 | 0.8 | 0.1 | 10 | 5500 |
| IM5 | 1.5 | 8.E+04 | 6 | 6 | 1 | 0.2 | 9 | 4800 |
| IM6 | 0.9 | 1.E+05 | 7 | 7 | 1.5 | 0.2 | 6 | 3000 |
| IM7 | 2.1 | 1.E+05 | 6 | 6 | 0.8 | 0.1 | 13 | 6300 |
| IM8 | 12.0 | 8.E+02 | 5 | 5 | 0.8 | 0.2 | 60 | 6000 |
| IM9 | 2.0 | 3.E+02 | 3 | 3 | 0.1 | 0.03 | 6 | 7500 |
| IM10 | 0.6 | 4.E+04 | 20 | 18 | 18 | 1.0 | 11 | 1200 |
| IM11 | 2.7 | 2.E+03 | 4 | 4 | 0.02 | 0.01 | 11 | 7100 |
| IM12 | 5.0 | 1.E−01 | 5 | 5 | 0.08 | 0.02 | 25 | 6900 |
| IM13 | 2.7 | 9.E+02 | 2 | 2 | 0.01 | 0.01 | 5 | 9900 |
| IM14 | 1.5 | 6.E+03 | 6 | 6 | 0.8 | 0.13 | 9 | 5800 |
| IM15 | 1.0 | 3.E+02 | 23 | 20 | 20 | 1.0 | 20 | 1000 |
| CM1 | 4.2 | 3.E−02 | 6 | 6 | 0.6 | 0.10 | 25 | 3500 |
| CM2 | 0.6 | 2.E+03 | 45 | 20 | 40 | 0.5 | 12 | 500 |
| CM3 | 0.7 | 5.E+05 | 18 | 10 | 18 | 0.6 | 7 | 500 |

※IM: Inventive Material, CM: Comparative Material

As can be seen from Table 1, a ferrite material that contains at least Fe and Co and meets such conditions that metal composition ratios of $Fe_aNi_bZn_cCo_d$ in the film are $2.1 \leq a \leq 2.6$, $0 \leq b \leq 0.3$, $0 \leq c \leq 0.4$, and $0.1 \leq d \leq 0.4$ where $a+b+c+d=3.0$ has good characteristics in which a natural resonance frequency fr, at which the real part of the magnetic permeability $\mu'$ is reduced to a half, is at least 1 GHz.

Further examination revealed that, if a product of $\mu'$ of a ferrite material and the thickness t of the material at 950 MHz is less than 5 μm, then the ferrite material provides less effects in miniaturizing and widening the band in a case where the ferrite material is applied to an EBG structure. Therefore, in the case where a ferrite material is applied to an EBG structure as in this embodiment, a product of $\mu'$ of the ferrite layer and the thickness t of the ferrite layer at 950 MHz is preferably set to be at least 5 μm. Furthermore, it also revealed that, if a value of tan $\delta(=\mu''/\mu')$ of a ferrite material is greater than 1.0 at 950 MHz, the loss becomes so large that the ferrite material is not suitable for use in an antenna substrate. Therefore, if an excessively large loss becomes problematic, a value of tan $\delta(=\mu''/\mu')$ is preferably set to be 1.0 or less at 950 MHz. Additionally, it revealed that, if the resistivity of a ferrite material is less than 0.1 Ωcm, then the EBG characteristics are deteriorated by the conductivity of the ferrite material. Therefore, it is preferable for the ferrite material to have a resistivity of at least 0.1 Ωcm. Thus, it is possible to manufacture a magnetic film applicable to a GHz band, to which a conventional film would not have been applied, and to apply the film to an EBG structure.

For example, a ferrite material as described above may be formed on a support member, such as a resin sheet including PET, polyimide, and the like, or an antenna conductor, and may be arranged close to a conductor forming an EBG structure. Nevertheless, when a ferrite material is deposited directly on a conductor forming an EBG structure (e.g., the ground layer 10 in this embodiment), the effects in increase of an inductance component become more significant.

When an inductance component of an EBG structure is increased, for example, a resonance frequency of an LC parallel resonant circuit is lowered. Therefore, provision of a magnetic material layer on an EBG structure contributes to miniaturization of the EBG structure. A lowered resonance frequency in an LC parallel resonant circuit can also be achieved by increasing a capacitance component. However, to increase an inductance component is more advantageous in characteristics for reasons described below in detail.

Figure 5:
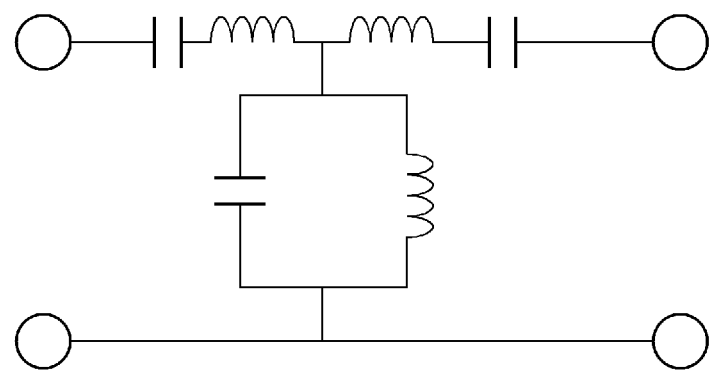
FIG. 5 is a diagram showing an equivalent circuit when the unit structure shown in FIG. 1 is seen from the above.

FIG. 5 is a diagram showing an equivalent circuit to a unit structure of an EBG structure. The aforementioned unit structure may be formed by an equivalent circuit shown in FIG. 6, in which the phase is shifted by half a period.

Figure 6:
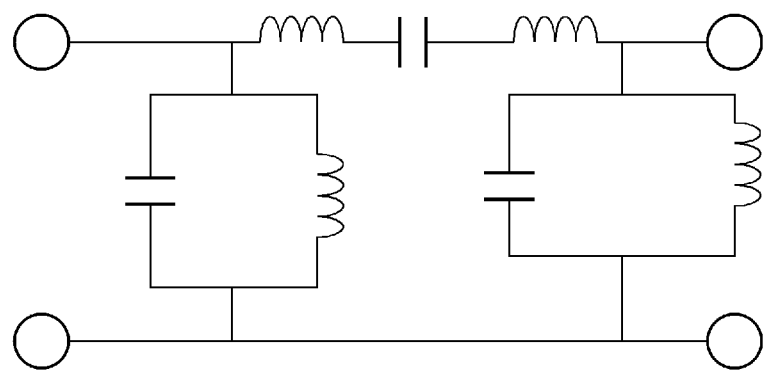
FIG. 6 is a diagram showing an equivalent circuit exchangeable with the equivalent circuit of FIG. 5.

When the unit structure is viewed in a direction perpendicular to a principal plane of the unit structure, the equivalent circuit shown in FIG. 5 or 6 can be approximated to an LC parallel resonant circuit within a proper frequency range for the sake of simplicity. This result is also expected from the fact that parallel connection structures of gaps and continuous conductors are formed between adjacent top layers 40.

Here, a surface impedance Zs of a surface that is approximated by an LC parallel resonant circuit having an inductance L and a capacitance C can be represented by the following formula (1):

$$Zs = \frac{j\omega L}{1 - LC\omega^2} \quad (1)$$

where ω is an angular frequency, L is an inductance, C is a capacitance, and j is the imaginary unit.

Here, the resonance angular frequency $\omega_0$ is represented by the following formula (2):

$$\omega_0 = \frac{1}{\sqrt{LC}} \quad (2)$$

Figure 7:
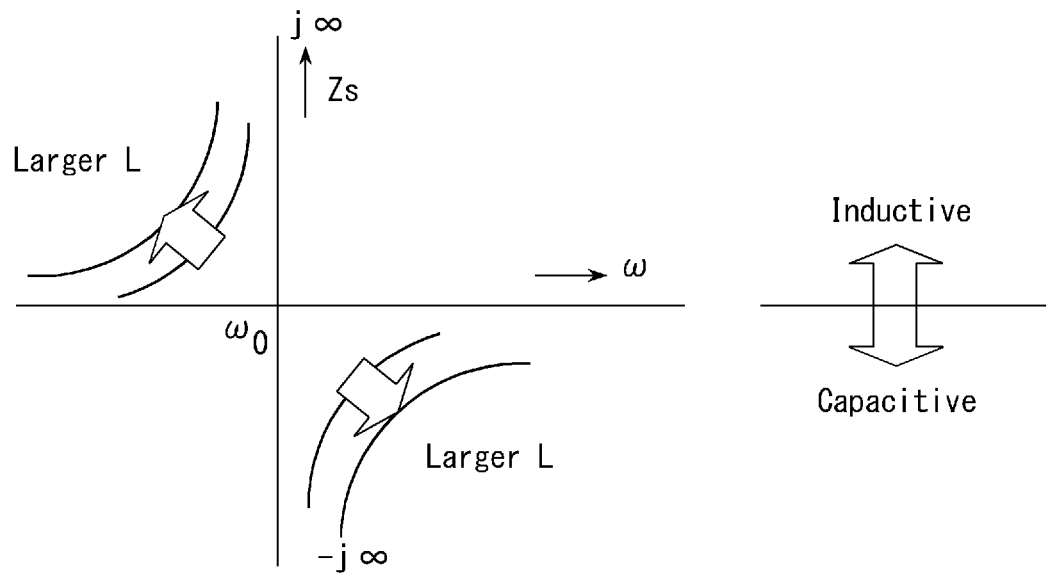
FIG. 7 is a diagram explanatory of how an increase of an inductance can widen a band in a high impedance region.
Figure 8:
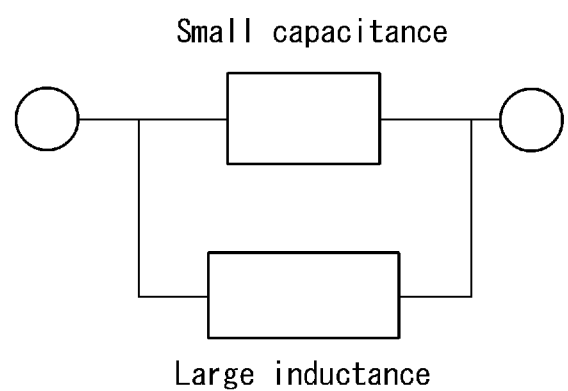
FIG. 8 is a diagram showing conditions for an equivalent circuit in order to widen a band in a high impedance region.

FIG. 7 shows a plot of the formula (1) in consideration of the formula (2). As can be seen from FIG. 7, under the condition where LC=constant (the resonance frequency is constant), a frequency band having a large surface impedance Zs is wider in a case of a large inductance component and a small capacitance component, as compared to that in a case of a small inductance component and a large capacitance component. When the surface impedance Zs is large, a plane wave entering on an EBG surface reflects in phase. Therefore, if the inductance component is larger, a frequency range of the EBG in which a plane wave reflects in phase becomes wider.

Therefore, the in-phase reflection effect can be obtained in a wide band by combination of a small capacitance and a large inductance in an LC parallel resonant circuit as shown in FIG. 6.

Meanwhile, a signal/noise transmission blocking region shifts toward lower frequencies as the inductance component becomes large as described above. Additionally, when an inductance component is increased by provision of a magnetic material, the signal/noise transmission blocking effect can also be obtained at higher frequencies. This is conceivably caused by influence from the loss due to μ" of the magnetic material. In any case, the signal/noise transmission blocking region can be widened by provision of a magnetic material on an EBG structure.

The magnetic material film 20 is not limited to the ferrite plating film as described above. A ferrite material may be produced by a general deposition method such as sputtering and arranged close to a conductive layer included in an EBG structure. Furthermore, it may be deposited directly on a conductive layer included in an EBG structure. Moreover, a ferrite material may be produced by a sintering method and arranged close to or in contact with a conductive layer included in an EBG structure.

Additionally, the magnetic material film 20 is not limited to a film formed of a ferrite material. For example, the magnetic material film 20 may be formed using a composite magnetic material including magnetic powder and resin binder. In this case, the noise absorption effect of the composite magnetic material itself can be obtained in a wider band, while the noise absorption effect of the EBG structure can concurrently be obtained in a wider band, too. Therefore, more effective noise restriction effect is expected.

Figure 9:
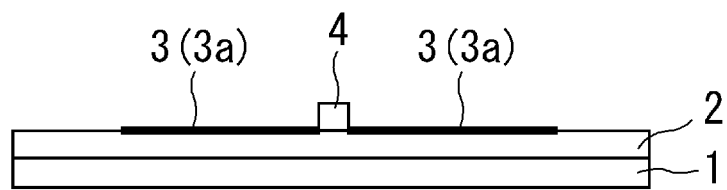
FIG. 9 is a diagram showing an RFID tag having the EBG structure shown in FIGS. 1 to 3.
Figure 10:
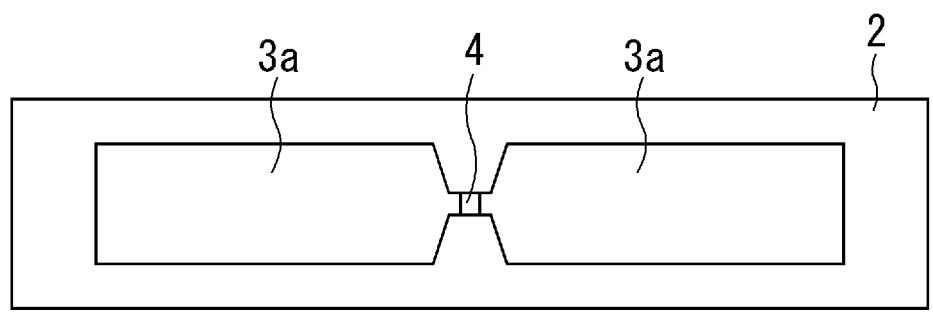
FIG. 10 is a plan view showing the RFID tag shown in FIG. 9.

Referring to FIGS. 9 and 10, there is shown an RFID tag having the aforementioned EBG structure 1. In some cases, a relatively transparent material (a material one can see the inside thereof) may be used as a practical dielectric material. In FIG. 10, however, the dielectric material is illustrated as being nontransparent for the sake of brevity.

In the illustrated RFID tag, an antenna support layer 2 formed of a dielectric material is formed on the EBG structure 1, which is in the form of a sheet. Furthermore, an antenna element 3 having a predetermined antenna pattern and an IC 4 connected to the antenna element 3 are arranged on an upper surface of the antenna support layer 2. As can be seen from FIG. 10, the antenna element 3 of this example is a dipole antenna including patterns 3a extending on both sides of the IC 4 symmetrically in a longitudinal direction of the EBG structure.

When the EBG structure 1 is configured so as to provide a high surface impedance in a frequency band of transmission by the antenna and arranged on a rear face of the antenna, then the characteristics of the antenna disposed near a metal can be improved due to the in-phase reflection effects in the frequency band of transmission by the antenna. In the case of the antenna disposed near the metal, a radiation field is cancelled by an electric field in opposite phase that has been reflected from the metal, so that the antenna performance is deteriorated. When an EBG structure having a high surface impedance is disposed between the antenna and the metal, the in-phase reflection of the EBG structure suppresses the influence from the metal near the antenna. For the same reasons, any antenna substrate other than RFID tags will also expect improvement of the antenna characteristics.

Figure 11:
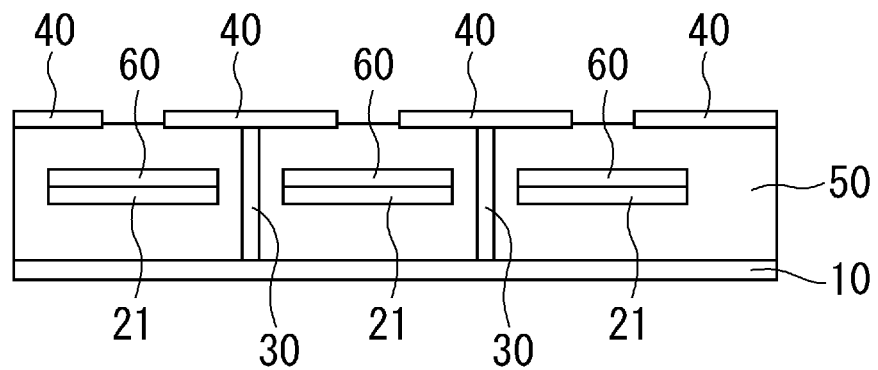
FIG. 11 is a diagram showing a variation of the EBG structure.

In the above embodiment, the magnetic material layer is formed on the ground layer. As shown in FIG. 11, however, a magnetic material layer 21 may be provided on a conductor producing a capacitance (the floating capacitor layers 60) or may be provided on the vias 30 or the like. Furthermore, a magnetic material layer may be provided at such a position as to be out of direct contact with any conductive layer, for example, at a position intermediate between the ground layer and the floating capacitor layers 60 within the dielectric layer 50. In this case, if the magnetic layer has slightly poor insulation characteristics, it is preferable to arrange the magnetic material layer so as to avoid contact with the vias.

Furthermore, the above embodiment has been described with an example of an EBG structure having a ground layer of a solid pattern. For example, however, this invention is applicable to an EBG structure having no ground layer of a solid pattern as disclosed by Patent Document 3. Specifically, a magnetic material layer may be included in an EBG structure having two conductive layers but no via. In this case, the magnetic material layer may be formed only on either surface or both surfaces of the upper conductive layer, or may be formed only on either surface or both surfaces of the lower conductive layer. Moreover, a magnetic material layer may be formed between those conductive layers so as to be out of contact with the conductive layers.

Figure 12:
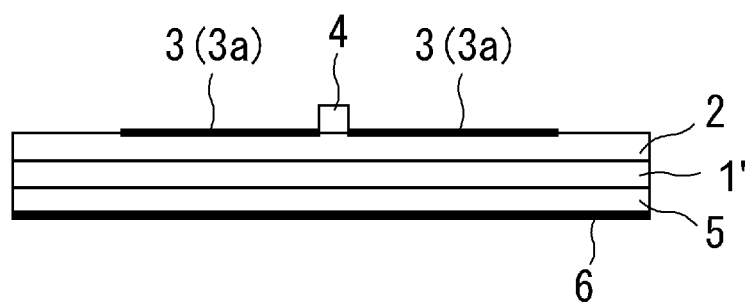
FIG. 12 is a diagram showing an RFID tag having an EBG structure including no ground layer of a solid pattern.

Additionally, in this invention, when a magnetic material layer is included in an EBG structure having no ground layer of a solid pattern, and an antenna device such as an RFID tag is formed with use of such an EBG structure, then, as shown in FIG. 12, a shield support layer 5 formed of a dielectric may be provided on a rear face of an EBG structure 1' (which includes a magnetic material layer but no ground layer of a solid pattern), and a shield layer 6 of a conductive material having a solid pattern may be formed on a lower surface of the shield support layer 5. Provision of such a shield layer 6 can reduce influence from a neighboring metal. Therefore, for example, an RFID tag can cope with metals.

Moreover, in order to lessen the correlation between the EBG structure and the antenna layer 3 or the correlation between the EBG structure 1 or 1' and the shield layer 6, the antenna support layer 2 or the shield support layer 5 should be increased in thickness or should be formed of a material having a low dielectric constant. Specifically, it is preferable to use, as a material for the antenna support layer 2 or the shield support layer 5, resin having the lowest possible dielectric constant, or foamed material, sponge, urethane, fiber, expanded polyethylene, acrylic foam including air, or the like. Particularly, because air concentrates electric fields in the air and reduces electric fields in a material, it is effective in use for an antenna device as the loss can be reduced.

Figure 13:
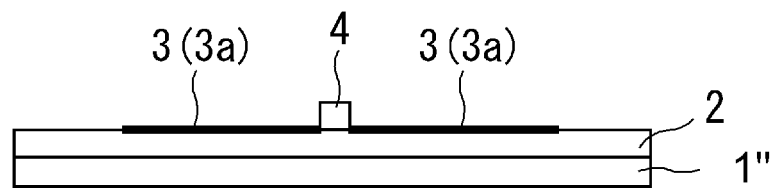
FIG. 13 is a diagram showing an RFID tag having an EBG structure according to a second embodiment of this invention.

Referring to FIG. 13, there is an RFID tag having an EBG structure according to a second embodiment of this invention. In the second embodiment, the same components as in the first embodiment are denoted in the drawings by the same reference numerals, and the explanation thereof is omitted from the following description.

Figure 14:
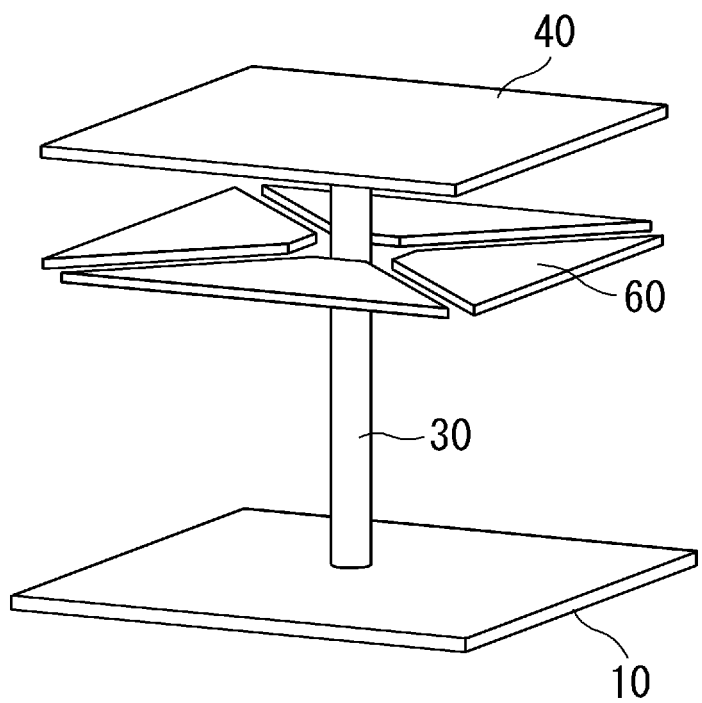
FIG. 14 is a perspective view schematically showing a unit structure of the EBG structure according to the second embodiment of this invention.
Figure 15:
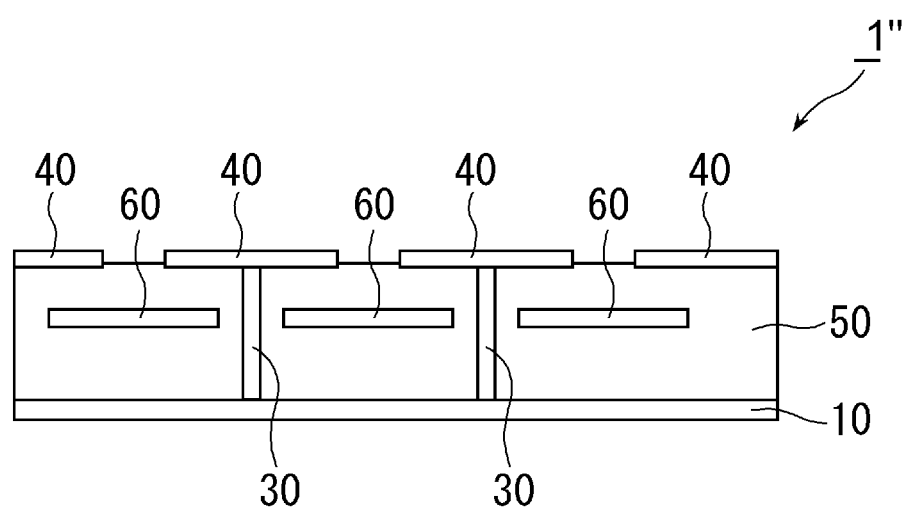
FIG. 15 is a cross-sectional view of the EBG structure according to the second embodiment of this invention.

As can be seen from FIGS. 14 and 15, an EBG structure 1" in this embodiment is a structure in which floating capacitor layers 60 have been added to what is called mushroom-type structures. Specifically, the EBG structure 1" in this embodiment has a ground layer 10 formed of a conductive layer having a solid pattern, vias 30 extending vertically from the ground layer 10, top layers 40 coupled to the ground layer by the vias 30, a dielectric layer 50 filled between the top layers 40 and the ground layer 10, and floating capacitor layers 60 held in a floating state within the dielectric layer 50 for increasing the capacity. The dielectric layer 50 is omitted from FIG. 14 to clarify the relationship between the components. In other words, the EBG structure 1" in this embodiment has a configuration in which the magnetic material layer 20 has been omitted from the EBG structure 1 in the first embodiment (FIGS. 1 and 2). In the antenna apparatus thus constructed, the antenna characteristics near a metal are improved by the in-phase reflection on the EBG structure 1".

Thus, applications that utilize a high surface impedance (an RFID tag and an antenna device) have mainly been described among applications of the EBG structure. According to this invention, an EBG structure having signal/noise transmission blocking characteristics in a wide band can be miniaturized. Therefore, the EBG structure may be used as a portion of a transmission line so as to form a noise filter, or may be disposed near a transmission line so as to form a noise absorption sheet capable of absorbing transmission noise. Alternatively, a substrate itself may be formed into an EBG structure, and a signal conductor may be provided thereon so as to form a wiring board having a noise absorption function. In these cases, use of a magnetic material such as a composite magnetic material having high loss characteristics in a frequency band other than signal frequencies is effective in widening a blocking region because a high frequency side of the blocking region can be increased.

The invention claimed is:

1. An antenna device comprising:
   (i) an electromagnetic bandgap structure comprising unit structures which are cyclically coupled to each other, the electromagnetic bandgap structure providing a high surface impedance in a specific frequency band when viewed in a direction perpendicular to a principal plane of the electromagnetic bandgap structure and blocking transmission of a signal of a noise in a predetermined frequency band when viewed in a direction parallel to the principal plane,
   wherein the electromagnetic bandgap structure includes a magnetic material portion at least in part,
   wherein each unit structure has at least one conductive layer, and the magnetic material portion is formed in contact with the conductive layer,
   wherein the magnetic material portion comprises a ferrite layer formed on an upper surface and/or a lower surface of the conductive layer
   wherein the ferrite layer comprises a ferrite plating film that has a structure in which crystal phases are arranged with respect to each other to reduce anisotropy dispersion on a basis of exchange coupling between the crystal phases, and
   wherein the electromagnetic bandgap structure is in a form of a sheet or a plate having a first principal plan which provides a high surface impedance and a second principal plane opposite to the first principal plane; and
   (ii) an antenna support layer of a dielectric formed on the first principal plane.

2. The antenna device as recited in claim 1, wherein the ferrite layer is formed of a ferrite material containing at least Fe and Co and meeting such conditions that metal composition ratios of $Fe_aNi_bZn_cCo_d$ in the film are $2.1 \leq a \leq 2.6$, $0 \leq b \leq 0.3$, $0 \leq c \leq 0.4$, and $0.1 \leq d \leq 0.4$, where $a+b+c+d=3.0$.

3. The antenna device as recited in claim 2, wherein the ferrite layer is formed so that a product of $\mu'$ the ferrite layer at 950 MHz and a thickness of the ferrite layer is at least 5 μm.

4. The antenna device as recited in claim 3, wherein the ferrite layer i formed of the ferrite material in which a value of $\tan \delta\ (=\mu''/\mu')$ is 1.0 or less at 950 MHz.

5. The antenna device as recited in claim 2, wherein the ferrite layer is formed of the ferrite material having a resistivity of at least 0.1 Ωcm.

6. The antenna device as recited in claim 1 further comprising an antenna element supported by the antenna support layer.

7. The antenna device as recited in claim 1, further comprising: a shield support layer of a dielectric formed on the second principal plane; and a shield layer supported by the shield support layer, the shield layer being formed of a conductor having a solid pattern.

8. An RFID (Radio Frequency Identification) tag comprising: the antenna device as recited in claim 1, and an IC connected to the antenna element on the antenna support layer, wherein the EBG structure serves as a portion of a tag substrate.

9. A noise filter comprising an antenna device which comprises:
   (i) an electromagnetic bandgap structure comprising unit structures which are cyclially coupled to each other, the electromagnetic bandgap structure providing a high surface impedance in a specific frequency band when viewed en a direction perpendicular to a principal plane of the electromagnetic bandgap structure and blocking transmission of a signal or a noise in a predetermined frequency band when viewed in a direction parallel to the principal plane,
   wherein the electromagnetic bandgap structure includes a magnetic material portion at least in part,
   wherein each unit structure has at least one conductive layer, and the magnetic material portion is formed in contact with the conductive layer, wherein the magnetic material portion comprises a ferrite layer formed on an upper surface and/or a lower surface of the conductive layer, wherein the ferrite layer comprises a ferrite plating film that has a structure in which crystal phases are arranged with respect to each other to reduce anisotropy dispersion on a basis of exchange coupling between the crystal phases, and wherein the electromagnetic bandgap structure is in a form of a sheet or a plate having a first principal plane which provides a high surface impedance and a second principal plane opposite to the first principal plane; and (ii) an antenna support layer of a dielectric formed on the first principal plane.

10. A wiring board with a noise absorption function, the wiring board comprising:

(a) an antenna device which comprises:

(i) an electromagnetic bandgap structure comprising unit structures which are cyclically coupled to each other, the electromagnetic bandgap structure providing a high surface impedance in a specific frequency band when viewed in a direction perpendicular to a principal plane of the electromagnetic bandgap structure and blocking transmission of a signal or a noise in a predetermined frequency band when viewed in a direction parallel to the principal plane, wherein the electromagnetic bandgap structure includes a magnetic material portion at least in part, where each unit structure has at least one conductive layer, and the magnetic material portion is formed in contact with the conductive layer, wherein the magnetic material portion comprises a ferrite layer formed on an upper surface and/or a lower surface of the conductive layer wherein the ferrite layer comprises a ferrite plating film that has a structure in which crystal phases are arranged with respect to each other to reduce anisotropy dispersion on a basis of exchange coupling between the crystal phases, and wherein the electromagnetic bandgap structure is in a form of a sheet or a plate having a first principal plane which provides a high surface impedance and a second principal plane opposite to the first principal plane; and (ii) an antenna support layer of a dielectric formed on the first principal plane; and (b) a signal conductor.

* * * * *